United States Patent [19]

Wilson et al.

[11] Patent Number: 5,572,405
[45] Date of Patent: Nov. 5, 1996

[54] THERMALLY ENHANCED BALL GRID ARRAY PACKAGE

[75] Inventors: James W. Wilson, Vestal; Stephen R. Engle, Binghamton; Scott P. Moore, Apalachion, all of N.Y.

[73] Assignee: International Business Machines Corporation (IBM), Armonk, N.Y.

[21] Appl. No.: 474,989

[22] Filed: Jun. 7, 1995

[51] Int. Cl.[6] .................................................... H05K 7/20
[52] U.S. Cl. .................. 361/705; 165/80.3; 257/724; 361/764; 361/784; 439/83
[58] Field of Search .................. 439/65, 68, 69, 439/74, 76, 83, 485; 165/80.3, 185; 257/706, 707, 713, 723, 724, 780; 174/52.2, 52.4, 260, 266; 361/704–713, 717–719, 761, 764, 767, 768, 776, 784

[56] References Cited

U.S. PATENT DOCUMENTS

| | | | |
|---|---|---|---|
| 4,563,725 | 1/1986 | Kirby | 361/388 |
| 4,591,659 | 5/1986 | Leibowitz | 174/68.5 |
| 4,993,148 | 2/1991 | Adachi et al. | 29/832 |
| 5,191,511 | 3/1993 | Sawaya | 361/383 |
| 5,291,062 | 3/1994 | Higgins | 257/698 |
| 5,297,006 | 3/1994 | Mizukoshi | 361/704 |
| 5,355,283 | 10/1994 | Marrs et al. | 361/760 |
| 5,409,865 | 4/1995 | Karnezos | 437/210 |
| 5,434,750 | 7/1995 | Rostoker | 361/784 |
| 5,473,814 | 12/1995 | White | 29/840 |
| 5,477,082 | 12/1995 | Buckley, III | 257/679 |

OTHER PUBLICATIONS

Bielick et al, "Heat Spreader for Tape Ball Grid Array and Plastic Ball Grid Array Rework", IBM Tech Disclosure Bulletin, vol. 37, No., 06B, Jun. 1994.

*Primary Examiner*—Gerald P. Tolin
*Attorney, Agent, or Firm*—Calfee, Halter & Griswold

[57] ABSTRACT

A thermally enhanced ball grid array package for electronic components, with an electronic and a plurality of ceramic component carriers bonded to a metal heat sink, enhances thermal performance, reduces solder ball fatigue and reduces stresses between the ceramic component carriers and the heat sink. Bonding the ceramic component carriers to the heat sink reduces expansion induced stresses of the solder balls on the carriers. Plural ceramic component carriers, smaller than a single carrier would have to be for the same package, reduce stresses at the interfaces between the ceramic component carriers and the heat sink.

10 Claims, 3 Drawing Sheets

THERMALLY ENHANCED BALL GRID ARRAY PACKAGE

BACKGROUND

This invention relates to an improved ball grid array (BGA) package for integrated circuit (IC) chips or dies, and to a method of producing these packages. More particularly, the invention relates to a ball grid array, with circuitized ceramic chip carriers, that improves thermal performance and reduces solder ball fatigue.

Electronic packages or components, with IC chips electrically connected by solder balls, wire bonds or the like to a ceramic chip carrier, which in turn is electrically connected by additional solder balls to another electronic component such as a printed circuit board assembly, are well known in the art. This type of package is frequently referred to as a "ball grid array" or "BGA" package.

In prior art BGA packages the chip and the ceramic chip carrier are frequently bonded to a copper or other metal sink or spreader. This removes heat from the die, to keep the die as cool as possible. Typical examples of this form of connector are disclosed in U.S. Pat. No. 5,355,283 to Marrs et al, U.S. Pat. No. 5,297,006 to Mizukoshi, U.S. Pat. No. 5,291,062 to Higgins, U.S. Pat. No. 5,191,511 to Sawaya and U.S. Pat. No. 4,993,148 to Adachi et al.

SUMMARY OF THE INVENTION

It is an object of this invention to provide a thermally enhanced package for electronic components such as integrated circuit chips and other solid state devices, and to provide a reliable, economical method for producing such packages.

Another object is to provide a ball grid array package that reduces solder ball fatigue.

Yet another objective is to provide a package for solid state electronic components, with ceramic component carriers bonded to a metal heat sink, that reduces stresses at the interface between the carriers and the heat sink.

These objectives are achieved with a package having a thermally conductive member with a first coefficient of thermal expansion, and a plurality of ceramic component carriers bonded to the heat sink. An integrated circuit chip or other electronic component is also bonded to the heat sink between the ceramic component carriers. The solid state component is electrically connected to conductive pathways in the ceramic component carriers. The conductive pathways are in electrical contact with solder balls or fusible conductors on at least one surface of the ceramic component carriers. As is customary, the solder balls served to electrically connect the package to a printed circuit board or other component.

The heat sink provides enhanced thermal performance. As the heat sink is bonded to the ceramic component conductors, differential expansion between the ceramic component carriers and the printed circuit board, which normally have a coefficient of thermal expansion that is more closely matched to the metal heat sink that to the ceramic component carriers, is reduced. This reduces solder ball fatigue. Using a plurality of smaller ceramic pieces also reduces the stress on the BGA solder balls and thereby reduces the fatigue of these solder balls.

These and other objects and advantages of this invention will be more readily apparent from the following discussion.

DRAWINGS

DETAILED DESCRIPTION

Figure 1:
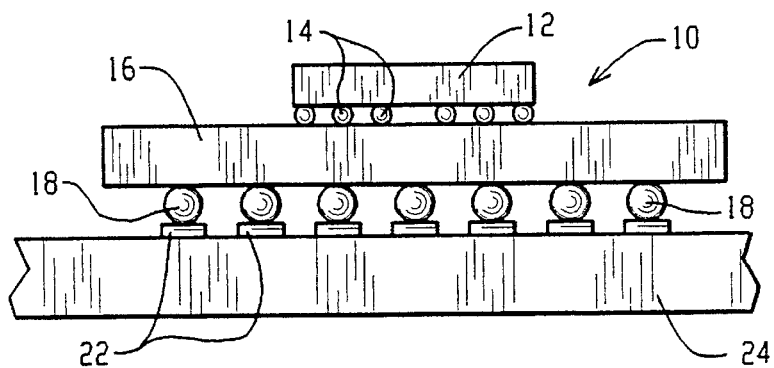
FIG. 1 is a schematic, cross-sectional elevation view of a typical prior art ball grid array or flip-chip package.
Figure 2:
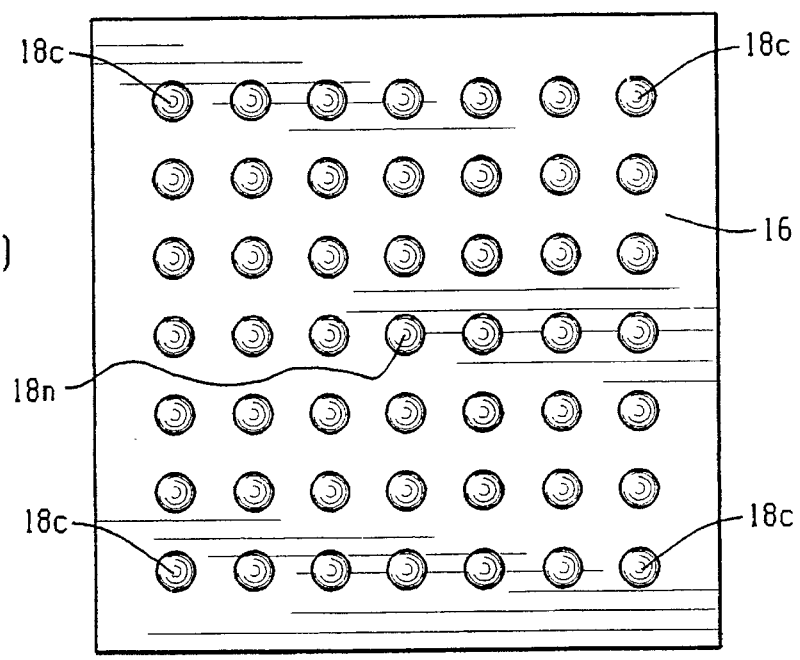
FIG. 2 is a bottom plan view of the ceramic carrier illustrated in FIG. 1.

FIGS. 1 and 2 are schematic views that represent typical prior art ball grid array or flip-chip packages. As shown in FIG. 1, package 10 includes an integrated circuit IC chip 12 with solder balls 14 formed upon or otherwise applied to the active surface of IC chip 12. The chip is inverted to form or apply the solder balls 14 and turned back over (or flipped) to connect the chip 12 to a ceramic component carrier 16. Hence the name "flip-chip".

The ceramic chip carrier 16 contains a number of conductive pathways (not shown) which connect the solder balls 14 on the chip 12 to solder balls 18 on the bottom of the ceramic carrier 16. These carriers are frequently referred to as "circuitized ceramic chip carriers".

The solder balls 18 on the ceramic carriers 16 are fused to bond them to conductive contacts 22 on a printed circuit board (PCB), shown schematically as 24. As illustrated in FIG. 1, the solder balls 18 that connect ceramic carrier 16 to the PCB 24 are larger than the balls 14 that connect the IC chip 12 to the ceramic carrier 16, and are spaced further apart. Typically, balls 14 are between about 3 and 5 mils in diameter, and spaced about 9 to 10 mils apart. Balls 18, on the other hand, are usually between about 30 and 35 mils in diameter and spaced about 40 to 50 mils apart. It would be desirable to make the balls 18 on the carrier 16 the same size, and with the same spacing, as the balls 14 on the chip, but components to which the ceramic carrier 16 is connected, and their manufacturing tolerances, tend to dictate a larger size and spacing for the balls 18 on the carrier 16.

As is normal in the operation of any electronic system, the chip 12, ceramic carrier 16 and printed circuit board 24 generate and/or absorb a good deal of heat in use. The chip, for example, can reach temperatures of 100° C. or more. These temperatures fluctuate in accordance with the operation of the system (components that are active generate additional heat), the ambient conditions and other factors. This cyclical heating and cooling produces cyclical thermal expansion and contraction. Different components and other parts are heated and cooled differently, and typically have different coefficients of expansion. Ceramic carriers such as 16 tend to have coefficients of expansion of about $6 \times 10^{-6}$ to $8 \times 10^{-6}$ cm/cm° C., while printed circuit boards, which may be constructed of glass filled epoxy fiberglass, commonly referred to as FR4, tend to have a coefficients of expansion in the range of $16 \times 10^{-6}$ to $21 \times 10^{-6}$ cm/cm° C.

The variations in expansion and contraction caused by variable heating and cooling, differences in coefficients of expansion and other factors tend to cause repetitive stresses between certain interconnected parts. For example, the ceramic carrier 16 has a lower coefficient of thermal expansion than printed circuit board 24 and, as it is closer to the IC chip 12, tends to be heated more rapidly. Thus, ceramic carrier 16 tends to expand at a different rate than the printed circuit board 24. The stress from this differential expansion is absorbed by the connections between the solder balls 18 on the ceramic carrier and the contacts 22 on the printed circuit board. This repetitive stress can lead to a condition known as "solder ball fatigue" and to eventual failure of the connections.

The amount of expansion, and the resulting stress and strain, are a function of the size of the respective components. The greatest stresses usually occur at the connections which are furthest from the neutral point of the adjoining components. By "neutral point" we mean the point where there is no relative expansion between two adjacent components or, in other words, at the point where there are no expansion induced stresses in the connection between them. For example, for the solder ball connection between ceramic carrier 16 and printed circuit board 24, the neutral point occurs at the central ball 18n in FIG. 2. All else being equal, the greatest stresses will be experienced by the balls 18c at the four corners of carrier 16, i.e. those farthest from the neutral point. In order to keep the stress on the solder balls 18c that are farthest from the neutral point within acceptable limits, the size of the ceramic chip carrier 16 must be limited. With typical materials, the distance from the neutral point to the furthest solder ball or balls should be no more than about 45 mm, and preferably no more than about 35. With the size and spacing of the solder balls and the components to which they are connected, this typically limits the array to no more than 360 to 600 balls.

Figure 3:
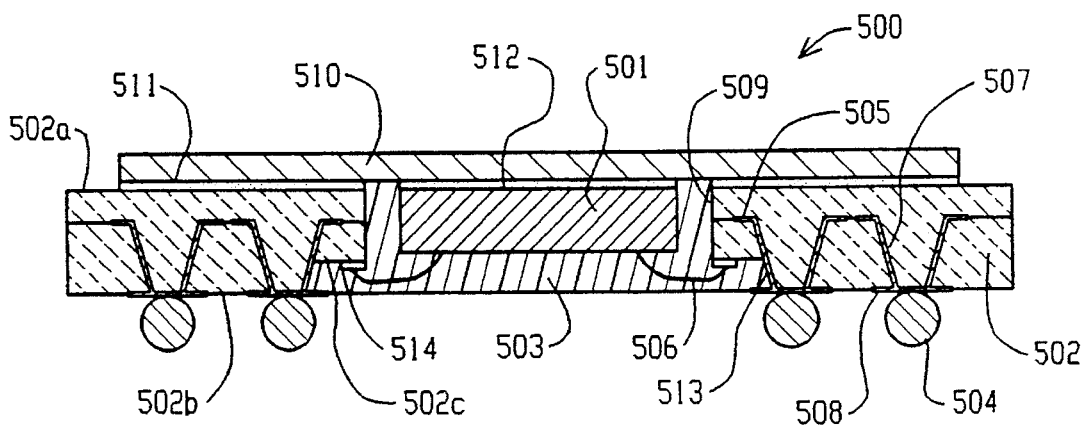
FIG. 3 is an elevation view of another prior art BGA package.

FIG. 3 illustrates another prior art ball grid array package, which is described in more detail in U.S. Pat. No. 5,355,283 to Marrs et al. In this array 500, a substrate 502 with a central hole 509 is bonded to a heat sink 510, which can be formed of copper or other materials having an acceptably high thermal conductivity, by an adhesive 511 such as an epoxy adhesive. An integrated circuit chip 501 is also bonded to the heat sink 510 by adhesive 512 within the central hole 509, which is subsequently filled with encapsulant 503.

Substrate 502 may be of an organic material, such as a thermoset or thermo-plastic resin, for economic ease and manufacturing, but may also be of an inorganic material such as glass or ceramic. This laminated construction reduces the solder ball fatigue problem significantly. In typical packages, the coefficient of thermal expansion of the printed circuit board or other component to which the assembly in FIG. 3 is bonded is closer to the coefficient of expansion of the metal heat sink 510 than to the coefficient of thermal expansion of the ceramic carrier 502. That means that, with the bonded structure shown in FIG. 3, the overall expansion of the ceramic substrate 502 is closer to the overall expansion of a PCB to which it is connected. Thus, there is less differential expansion, and less solder ball fatigue.

Unfortunately, reducing one problem creates another. The differences in coefficients of thermal expansion between metal heat sink 510 and ceramic substrate 502 creates stress in the adhesive layer 511. This is exaggerated by differences in heating and cooling rates. The metal heat sink is heated directly by conduction through a relatively large area of the adhesive patch 512. The ceramic substrate 502 is heated less directly by conduction through the metal heat sink 510 and through encapsulant 503. Thus, there are likely to be cyclical temperature differences that exaggerate differences in expansion due to differences in coefficient of thermal expansion.

As with the structure shown in FIGS. 1 and 2, this puts practical limits on the size of the package illustrated in FIG. 3. Assuming that the package is symmetrical, so that the neutral point for purposes of the bond between the metal heat sink and ceramic carrier 502 will be at the center of interface between the heat sink 510 and the IC chip 501, the distance from this neutral point to the furthest corner in the adhesive layer 511 is restricted by limits in allowable stresses in this adhesive layer. If this distance is too large and the package experiences normal cyclical expansion and contraction in operation, failures of the adhesive are likely.

Figure 4:
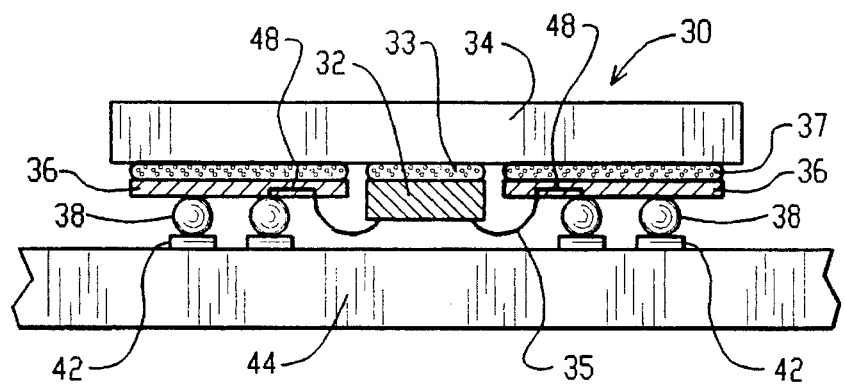
FIG. 4 is a cross-sectional elevation view of a BGA package embodying this invention.
Figure 5:
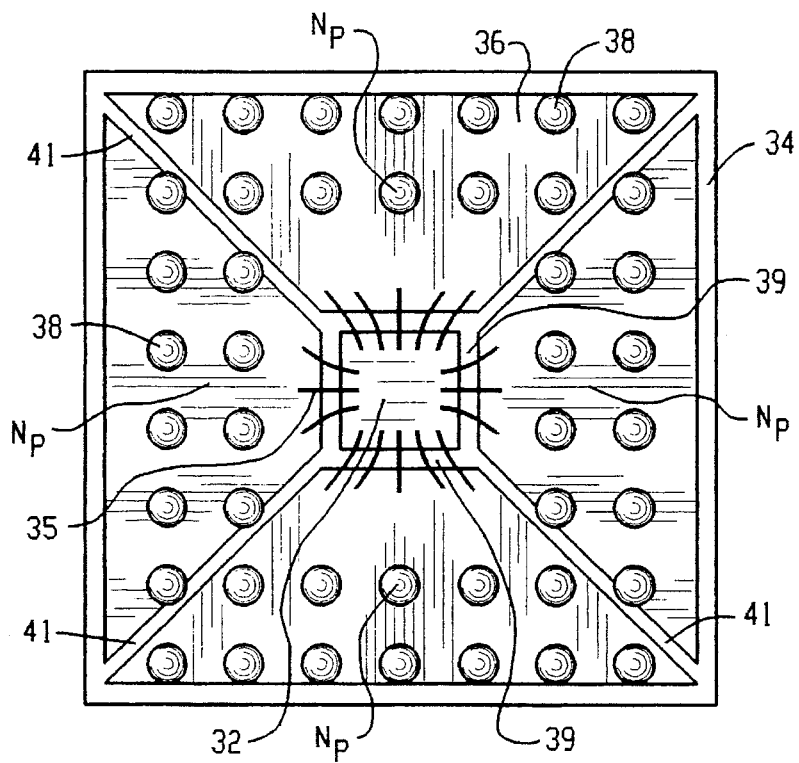
FIG. 5 is a bottom plan view of the IC chip, ceramic carrier section and heat sink shown in FIG. 4.

FIGS. 4 and 5 illustrate a package 30, embodying this invention, that addresses both the solder ball fatigue problem of the package 10 in FIGS. 1 and 2 and the heat sink/ceramic carrier expansion differential problem of the package 500 in FIG. 3. In package 30, as in package 500, an integrated circuit chip 32 is bonded by a layer 33 of a thermally conductive adhesive to a metal plate or heat sink 34, sometimes referred to as a heat spreader because it serves the distribute heat across the package 30. The heat sink 34 is preferably of copper, and the adhesive is preferably an epoxy such as 965IL epoxy from Ablestick Laboratories in Rancho Dominguez, Calif.

Chip 32 is connected by wire bonds 35 to conductive pathways (two of which are shown schematically as item 48 in FIG. 4) in four trapezoidal circuitized ceramic chip carriers 36. Each of these chip carriers 36 is bonded to the metal heat sink with adhesive 37, which is preferably the same as adhesive 33. Solder balls 38, which are connected by the conductive pathways in the chip carriers 36 and wire bonds 35 to the integrated circuit chip 32, are also connected to metal contacts 42 on a printed circuit board 44 or other component.

As in the package 500 discussed above, metal heat sink 34 controls expansion of the ceramic chip carriers 36 and, in typical installations, more closely matches the expansion characteristics of the printed circuit board 44. Both the metal heat sink 34 and the printed circuit board tend to have coefficients of expansion in the range of $16 \times 10^{-6}$ to $21 \times 10^{-6}$ cm/cm° C. As noted above, the ceramic carriers 36 tend to have coefficients of expansion of about $6 \times 10^{-6}$ to $8 \times 10^{-6}$ cm/cm° C.

Expansion of the heat sink/ceramic carrier laminate depends primarily on the expansion of the metal heat sink 34. The similarity between the coefficients of thermal expansion for the metal heat sink 34 (which controls expansion of the laminated heat sink/ceramic carrier structure) and printed circuit board 44 minimizes solder ball fatigue. Moreover, the use of a plurality of ceramic chip carriers 36 reduces the problems caused by mismatches in expansion between the metal heat sink and the ceramic carriers. As shown in FIG. 5, the neutral point (Np), for purposes of the bond between the ceramic chip carriers 36 and the metal heat sink 34 is at or near geometric center of the chip carriers. The distance from this neutral point to any corner along the base or outer edge of a chip carrier is significantly less, for a comparable size, than the distance from the center of package 500 to any of the corners of the adhesive layers 511. Thus, for a given size package, there will be less stress in the adhesive layers 37 in package 30 than in the adhesive layer 511 in package 500. This means that, with the structure of this invention, as illustrated in FIGS. 4 and 5, packages can be made wider, providing room for additional contacts with the PCB 44. Alternatively, the solder balls 38 and PCB contacts 42 can be spaced more widely, which may improve reliability and/or manufacturing recoveries.

Figure 7:
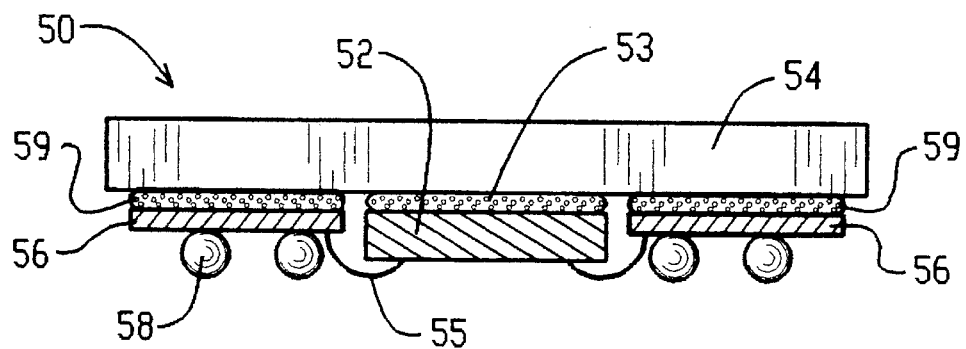
FIG. 7 is a cross-sectional elevation view of another embodiment of this invention.
Figure 8:
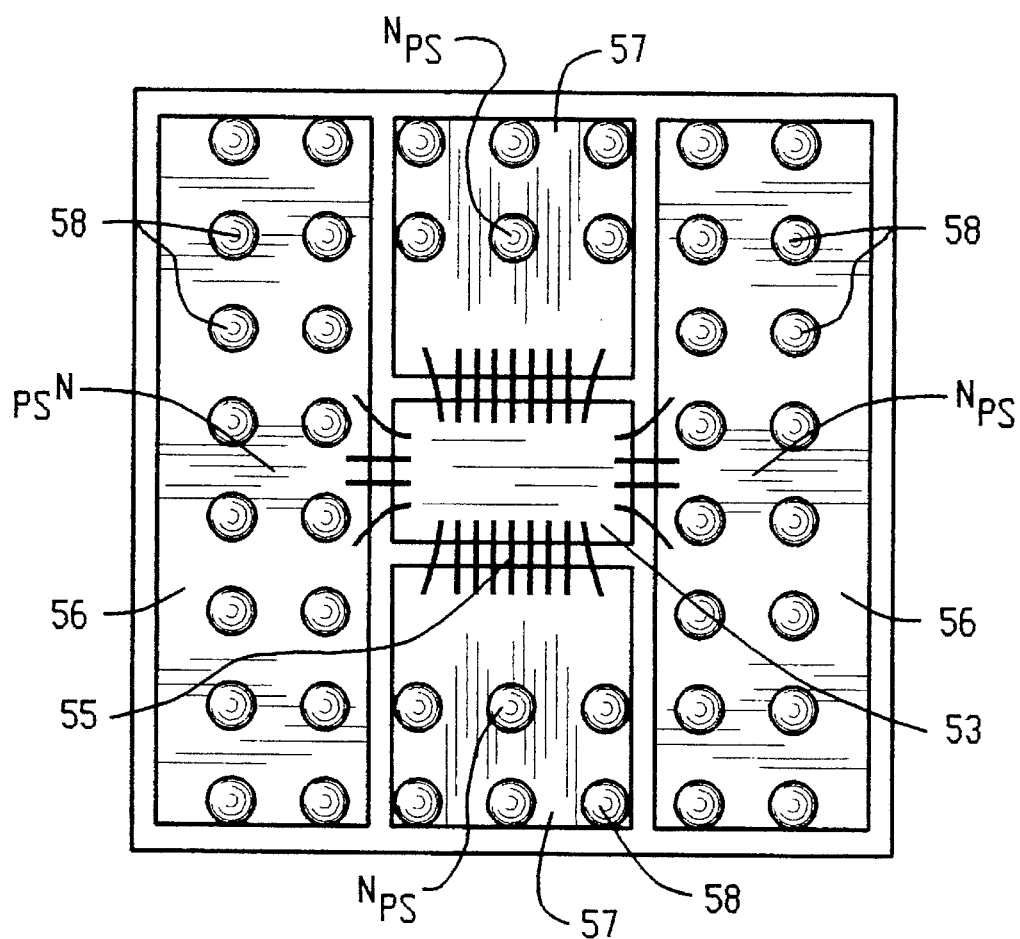
FIG. 8 is a bottom plan view of the embodiment shown in FIG. 7.

FIGS. 7 and 8 illustrate another package 56 embodying this invention. Again, an IC chip 52 is bonded by adhesive 53 to a metal heat sink 54. The chip is electrically connected by wire bonds 55 through conductive pathways (not shown) in circuitized ceramic chip carriers 56, 57 to solder balls 58 on chip carriers 56 and 57. The solder balls in turn provide electrical connections with a printed circuit board (not shown) or other component. The chip carriers 56 and 57 are bonded by adhesive 59 to heat sink 54.

As shown in FIG. 7, package 50 uses two different shapes of ceramic chip carrier. Two of the chip carriers 56 are longer rectangles that extend for substantially the entire width of the metal heat sink 54. The other chip carriers 57, which are shorter, are positioned between the ends of the longer chip carriers 56.

It is apparent that the distance from the neutral point (Npl) of either of the longer chip carriers 56 to a corner of these carriers is significantly longer that the distance from the neutral point (Nps) of either of the shorter chip carriers 57 to one of its corners. However, the distance from the neutral point of either long chip carrier 56 to its corners is still significantly less than the distance from the neutral point of the prior art package 500 in FIG. 3 to the furthest point in the adhesive layer 511 that bonds the ceramic substrate 502 to the metal heat sink 510 in that package. Thus, stresses in the adhesive layer 59 bonding the longer chip carriers 56 to the heat sink 54 will be significantly less than those in package 500. In many cases, the structure shown in FIGS. 7 and 8, while not reducing stresses as much as in other configurations, keeps stresses within acceptable levels. At the same time, this structure may yield significant manufacturing economies. If further stress reduction is desired, the long chip carriers 56 may be subdivided, e.g., along the horizontal center line of the package. Various other alternatives will be readily apparent to those skilled in the art.

Figure 6:
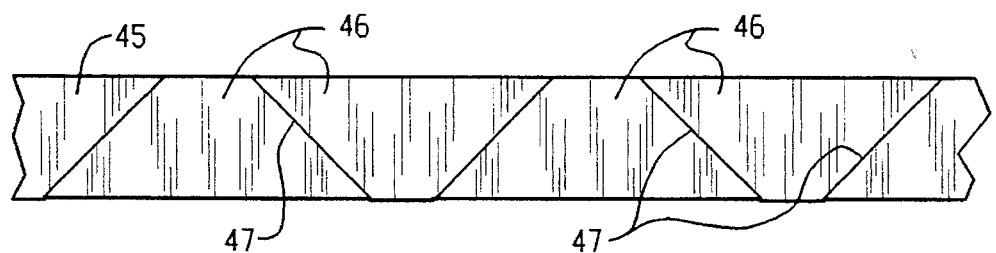
FIG. 6 illustrates a step in the production of ceramic component carriers for the package shown in FIGS. 4 and 5.

In the method of this invention, the chip carriers are formed by conventional processes, typically by forming a sheet of circuitized ceramic and then slitting the sheet into chip carriers of the desired configuration. As shown in FIG. 6, a strip 45 of circuitized ceramic carrier material may be cut into a series of trapezoidal blanks 46 by alternating 45° degree cuts 47. Solder balls are formed on or otherwise applied to the surface of the trapezoidal blanks 47, either before or after slitting, to produce the chip carriers 36.

An integrated circuit chip and the desired number and configuration of ceramic chip carriers are then adhesively bonded to the metal heat sink. Typically, as shown in FIGS. 4, 5, 7 and 8, the chip will be at the center of the package to facilitate wire bonding of the chip to the conductive pathways in the chip carriers. The package is now ready to be positioned on a printed circuit board or other component and heated to form a reliable connection.

Thus, it may be seen that this invention provides a method and apparatus for forming reliable ball grid array connections between integrated circuit chips and PC boards or other components. Solder ball fatigue and stresses between ceramic chip carriers and metal heat sinks are substantially reduced. This provides the designer with room for larger packages and/or more reliable connections. As those skilled in the art will readily appreciate, the invention provides a good deal of flexibility for dealing with special considerations in specific packages. Many modifications may be made in the embodiments disclosed above within the scope of this invention, which is defined by the following claims.

We claim:

1. A thermally enhanced electronic package comprising:
   a thermally conductive member having a first coefficient of thermal expansion;
   a first electronic component bonded to said thermally conductive member;
   a plurality of discreet connector members bonded to said thermally conductive member and each having:
      at least one coefficient of thermal expansion different from said first coefficient of thermal expansion;
      a plurality of fusible conductors on at least one surface; and
      a plurality of conductive passageways;
   said electronic component being electrically connected to conductive passageways in a plurality of said connector members and electrically connected through said passageways to said fusible conductors.

2. A package according to claim 1, further comprising a second electronic component having conductive contacts on at least one surface, said fusible conductors being fused to said conductive contacts.

3. A package according to claim 2 wherein said fusible conductors comprise solder balls and said second electronic component comprises a printed circuit board.

4. A package according to claim 3 wherein said first electronic component comprises an integrated circuit chip.

5. A package according to claim 4 wherein said integrated circuit chip is connected to said conductive passageways by wire bonds, whereby said chip is electrically connected to said printed circuit board by said wire bonds, said conductive pathways and said solder balls.

6. A package according to claim 1 wherein said thermally conductive member comprises a copper heat sink, and said connector member comprises a ceramic.

7. A package according to claim 6 wherein said copper heat sink has a coefficient of thermal expansion of about $16 \times 10^{-6}$ to $21 \times 10^{-6}$ cm/cm° C. and said connector members have a coefficient of thermal expansion of about $6 \times 10^{-6}$ to $8 \times 10^{-6}$ cm/cm° C.

8. A package according to claim 7 wherein said connector members are bonded to said copper heat sink with a thermally conductive adhesive.

9. A package according to claim 8 wherein said conductive adhesive comprises an epoxy.

10. A package according to claim 1 having four of said connector members, each of said carriers having a trapezoidal shape, a first edge and a second edge, said second edge being parallel to and shorter than said first edge and positioned adjacent to said first electronic component.

* * * * *